United States Patent [19]

Deresh et al.

[11] 4,053,773
[45] Oct. 11, 1977

[54] MOSAIC INFRARED SENSOR

[75] Inventors: Bruce A. Deresh, Dewitt; Robert J. Chevako, Fabius, both of N.Y.

[73] Assignee: The United States of America as represented by the Secretary of the Air Force, Washington, D.C.

[21] Appl. No.: 669,542

[22] Filed: Mar. 23, 1976

[51] Int. Cl.² .................. H01J 39/12; H01L 27/14
[52] U.S. Cl. .................. 250/349; 250/208; 250/347; 250/578
[58] Field of Search .......... 250/349, 347, 348, 578, 250/208

[56] References Cited

U.S. PATENT DOCUMENTS

| 3,353,022 | 11/1967 | Schwartz | 250/347 |
| 3,542,477 | 11/1970 | Grey | 250/349 |
| 3,557,369 | 1/1971 | Rubin | 250/349 |
| 3,962,577 | 6/1976 | Lindley | 250/208 |
| 4,005,285 | 1/1977 | Price | 205/208 |

Primary Examiner—Harold A. Dixon
Attorney, Agent, or Firm—Joseph E. Rusz; Willard R. Matthews, Jr.

[57] ABSTRACT

A two-dimensional, AC-coupled, wide dynamic range, mosaic infrared sensor is realized by apparatus that divides incoming infrared radiation into two equal beams. Each beam is received with or without optical concentration by an infrared detector array consisting of a multiplicity of spaced, parallel columns of electrically insulated, independently wired infrared detector elements. The detector element column widths of each detector array are substantially equal to the intercolumn spaces of the other detector array and the columns of each are optically aligned with the intercolumn spaces of the other.

1 Claim, 3 Drawing Figures

MOSAIC INFRARED SENSOR

STATEMENT OF GOVERNMENT INTEREST

The invention described herein may be manufactured and used by or for the Government for governmental purposes without the payment of any royalty thereon.

BACKGROUND OF THE INVENTION

This invention relates to mosaic infrared sensors and in particular to the adaptation of devices of that type to use in such applications as the direct transmission of time dependent two-dimensional infrared images with real time video reception, the nonscanning tracking of infrared emitting objects, and thermal imaging (nondestructive testing).

In the past various devices such as electron beam readout (VIDICON), charge coupled devices (CCD), charge injection devices (CID) and spaced lead conventional arrays have been used for these purposes. For some applications and particularly as adapted for infrared, however, these prior devices have been found wanting in certain respects. For instance, the first three devices have either a low dynamic range or any generally DC coupled in their readout while spaced lead conventional arrays have blind spots and are generally low resolution devices.

these limitations can be overcome by the use of two-dimensional mosaic infrared sensing devices of the type described here. State-of-the-art fabrication techniques such as electron beam lithography and laser machining permit the ready manufacture of single crystal photoconductive and photovoltaic detectors. One-dimensional multielement mosaics can be produced by these methods having fabrication and wiring blind areas less than 1 percent of the active area. The direct readout capabilities and the single element dimensions in the milli-inch region characteristic of these cells allow high responsivity and resolution with low noise.

However, the principal difficulty encountered in the fabrication of direct readout two-dimensional arrays using these devices is the problem of providing electrical connections to each photoconductive or photovoltaic detector in the array without causing unacceptably large blind spots.

Current technology is capable of manufacturing and wiring a linear or column array of ten detectors with acceptable interdetector spacings (regarding blind spots). These sub-arrays can be further combined to produce larger linear or column arrays with detectors numbering several hundred to as much as several thousand. To date, however, two-dimensional device of this type have not been developed due to blind spots resulting from electrical connections between adjacent columns. The present invention is directed toward solving this problem.

SUMMARY OF THE INVENTION

The basic unit of the device of the invention is a column of infrared detector elements (photovoltaic or photoconductive cells). A multiplicity of these columns are arranged in spaced parallel relationship to form an infrared detector unit. There are two essentially identical detector units. Received infrared radiation is divided by a beam splitter to form two separated, equal, infrared beams. A detector with or without optical concentration elements intercepts each beam. The detector units are spatially remote and are positioned such that the infrared detector element columns of each optically interleave with the intercolumn spaces of the other.

It is a principal object of the invention to provide a new and improved mosaic infrared sensor from conventional photodetector technology.

It is another object of the invention to provide an infrared sensor that will provide a high resolution, low noise, two-dimensional electronic image with negligible blind spots.

It is another object of the invention to produce, from state-of-the-art column arrays, a mosaic infrared sensor array capable of AC-coupled, wide dynamic range readout and that is highly responsive to infrared radiation in the 1–16 micron wavelength region.

These, together with other objects, advantages and features of the invention, will become more readily apparent from the following detailed description when taken in conjunction with the illustrated embodiment in the accompanying drawings.

DETAILED DESCRIPTION OF THE PREFERRED EMBODIMENT

Figure 1:
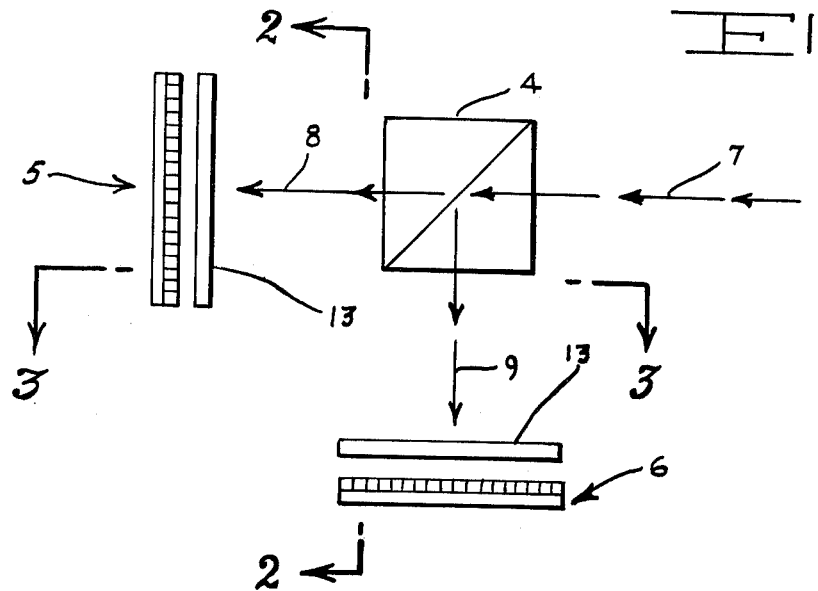
FIG. 1 is an elevational view of one presently preferred embodiment of the invention.
Figure 2:
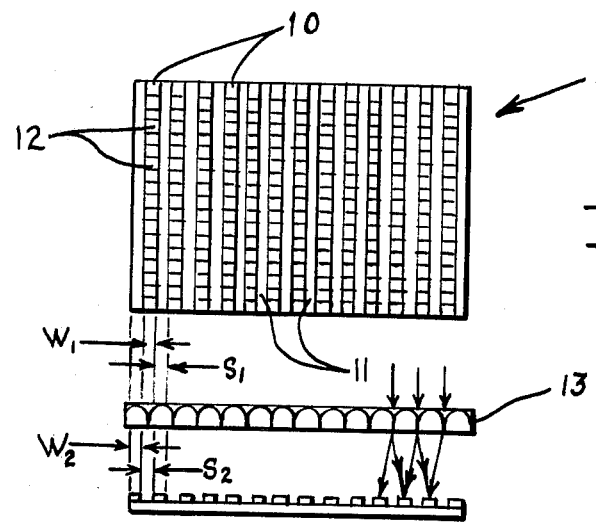
FIG. 2 is a sectional view of FIG. 1 taken at 2—2.
Figure 3:
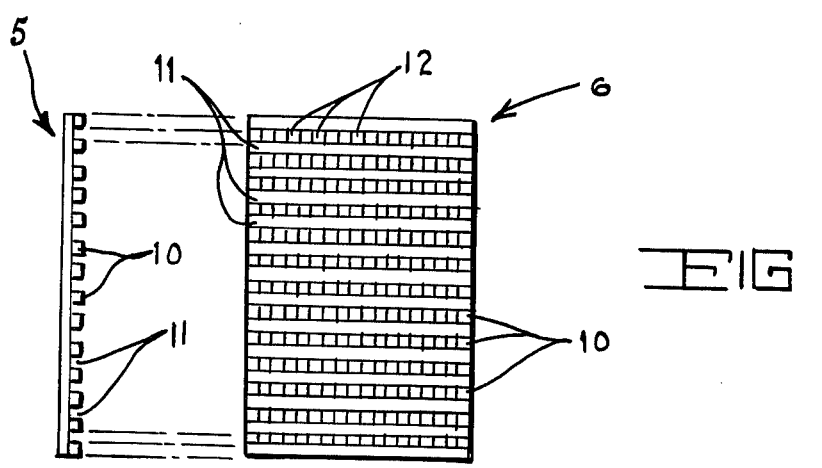
FIG. 3 is a sectional view of FIG. 1 taken at 3—3.

The mosaic infrared sensor of the invention comprises the beam splitter 4, an optional concentrator 13, and the infrared detector units 5 and 6 illustrated in FIGS. 1—3 of the drawings. Beam splitter 4 divides the incident infrared radiation 7 into substantially equal, separated, infrared beams 8 and 9. The optical concentrator 13 can be of the lenticular type as shown and recovers some of the otherwise wasted energy. Infrared detector units 5 and 6 are positioned to intercept beams 8 and 9 as shown in FIG. 1. Each detector unit comprises an array of $m$ columns 10 of $n$ infrared detector elements (photovoltaic or photoconductive cells) 12. Columns 10 of detector unit 5 have widths $W_1$ and are spaced at distances $S_1$. Columns 10 of detector unit 6 have widths $W_2$ and are spaced at distances $S_2$. In accordance with the principles of the invention $W_1 \approx S_2$ and $W_2 \approx S_1$. In practice $W_1$, $S_1$, $W_2$ and $S_2$ can be made approximately equal to each other. Further, in accordance with the principles of the invention the columns 10 of detector unit 5 are made to optically align with the intercolumn spaces 11 of detector unit 6. The column widths and intercolumn spacings are, however, a matter of design and other ratios can be used as long as the column of each detector unit optically interleaves with and substantially fills the intercolumn spaces of the other. Intercolumn spacing dimensions are normally a function of electrical connection requirements. By way of example, an operable device can be fabricated in which each detector unit consists of 50 columns of 100 detector elements. The detector elements would be 5 mils long and 7 mils wide. The resulting 7 mil wide column would be separated by 7.25 mil spaces.

The electrical connections to the individual detector elements of the mosaic conveniently may be brought out through its back surface, and the outputs appearing on these connections then may be AC coupled to the associated readout and processing circuitry. Any of several known readout techniques may be employed, with the detector elements being addressed one, two or more at a time or all at once as preferred.

While the invention has been described in one presently preferred embodiment, it is understood that the words which have been used are words of description rather than words of limitation and that changes within the purview of the appended claims may be made without departing from the scope and spirit of the invention in its broader aspects.

Specifically, additional detector plane geometries which give substantially complete division of the focal plane optical energy into two complementary detector configurations, together with a compatible set of optical concentrators, fall within the scope of the present invention. One such alternative configuration, for example, would involve the division of the detector plane into radial and azimuthal components, in an arrangement providing interleaving concentric circular segmented rings of detector elements. Rotationally symmetric optical concentrator plates could be included for optical concentration if desired.

What is claimed is:

1. A mosaic infrared sensor comprising:

a. first and second arrays of $m$ spaced, juxtaposed columns of $n$ discrete, contiguous infrared detector elements, the infrared detector columns of said first array having widths substantially equal to the spacings between the infrared detector columns of said second array and the infrared detector columns of said second array having widths substantially equal to the spacings between the infrared detector columns of said first array, the infrared detector columns of each array being aligned with the inter-column spacings of the other array;

b. beam splitting means adapted to divide received infrared energy into first and second substantially equal sources of infrared energy, said first array being in intercepting relationship with said first source of infrared energy and said second array being in intercepting relationship with said second source of infrared energy, and c. an optical concentrator means disposed between said beam splitting means and each array of infrared detector element columns, each said optical concentrator means being adapted to focus infrared energy from said beam splitting means onto the infrared detector element columns.

* * * * *